(12) United States Patent
Plihon

(10) Patent No.: US 8,486,201 B2
(45) Date of Patent: Jul. 16, 2013

(54) METHOD FOR DRYING A SEMICONDUCTOR WAFER

(75) Inventor: Aurelia Plihon, Villach (AT)

(73) Assignee: Lam Research AG, Villach (AT)

( * ) Notice: Subject to any disclaimer, the term of this patent is extended or adjusted under 35 U.S.C. 154(b) by 0 days.

(21) Appl. No.: 13/377,879

(22) PCT Filed: Jul. 1, 2010

(86) PCT No.: PCT/IB2010/053020
§ 371 (c)(1),
(2), (4) Date: Dec. 13, 2011

(87) PCT Pub. No.: WO2011/007287
PCT Pub. Date: Jan. 20, 2011

(65) Prior Publication Data
US 2012/0085372 A1      Apr. 12, 2012

(30) Foreign Application Priority Data

Jul. 16, 2009    (AT) ................... A 1123/2009

(51) Int. Cl.
*B08B 3/04*         (2006.01)
(52) U.S. Cl.
USPC ............... 134/26; 34/330; 34/337; 34/340; 34/341; 34/351; 34/352; 438/906; 134/2; 134/3; 134/21; 134/28; 134/30; 134/34; 134/35; 134/36; 134/41; 134/42

(58) Field of Classification Search
USPC ..... 34/330, 337, 340, 341, 351, 352; 438/906; 134/2, 3, 21, 26, 28, 30, 34, 35, 36, 41, 42
See application file for complete search history.

(56) References Cited

U.S. PATENT DOCUMENTS

| 5,882,433 | A | 3/1999 | Ueno |
| 6,227,212 | B1 * | 5/2001 | Konishi et al. ............... 134/1.3 |
| 2002/0062841 | A1 * | 5/2002 | Twu et al. .................... 134/3 |
| 2002/0069899 | A1 | 6/2002 | Verhaverbeke |
| 2002/0121286 | A1 * | 9/2002 | Verhaverbeke et al. ...... 134/1.3 |
| 2009/0025755 | A1 * | 1/2009 | Eom et al. .................... 134/30 |
| 2009/0032062 | A1 * | 2/2009 | Randhawa et al. ........... 134/18 |
| 2010/0200547 | A1 * | 8/2010 | Higashijima et al. ......... 216/92 |

FOREIGN PATENT DOCUMENTS

| JP | 2002151394 | 4/1998 |
| KR | 10-1998-0011979 | 5/2002 |
| WO | 2008041211 | 4/2008 |

OTHER PUBLICATIONS

International Search Report dated Mar. 17, 2011, in PCT application.

* cited by examiner

*Primary Examiner* — Bibi Carrillo
(74) *Attorney, Agent, or Firm* — Young & Thompson

(57) ABSTRACT

Disclosed is a method for drying a plate-like article; the method including rinsing with an aqueous rinsing liquid with subsequent rinsing with an organic solvent,
- wherein the organic solvent has a water content of below 20 mass-%
- wherein the organic solvent is supplied at a solvent temperature, which is at least 30° C. and not higher than 60° C.

18 Claims, No Drawings

METHOD FOR DRYING A SEMICONDUCTOR WAFER

TECHNICAL FIELD

The invention refers to a method for drying a surface of a disc-shaped article. More specifically the invention refers to a method for drying by rinsing with an aqueous rinsing-liquid with subsequent rinsing with an organic solvent.

BACKGROUND ART

Methods for drying a surface of a disc-shaped article are typically used in semiconductor industry for cleaning silicon wafer during production processes (e.g. pre photo clean, post CMP-cleaning, and post plasma cleaning). However, such a drying method may be applied for other platelike articles such as compact discs, photo masks, reticles, magnetic discs or flat panel displays. When used in semiconductor industry it may also be applied for glass substrates (e.g. in silicon-on-insulator processes), III-V substrates (e.g. GaAs) or any other substrate or carrier used for producing integrated circuits.

Several drying methods are known in semiconductor industry. Many drying methods use a defined liquid/gas boundary layer. Such drying methods are better known as Marangoni drying methods.

U.S. Pat. No. 5,882,433 discloses a combined Marangoni spin drying method. Thereby deionised water is dispensed onto a wafer and simultaneously a mixture of nitrogen with 2-propanol is dispensed. The 2-propanol in the nitrogen shall influence the liquid/gas boundary layer in that a surface gradient shall occur, which leads to the effect that the water runs of the wafer without leaving any droplets on the wafer (Marangoni Effect). The gas dispenser directly follows the liquid dispenser while the liquid dispenser is moved from the centre to the edge of the wafer and while the wafer is spun and thereby gas directly displaces the liquid from the wafer. Alternatively U.S. Pat. No. 5,882,433 discloses a method where an aqueous solution is removed by an organic solution.

The latter has the problem that an increase of defects occurred when drying a wafer. However, the increase of watermarks did not always occur but the negative effect increased when switching from 200 mm technology to 300 mm.

It is therefore an object of the invention to avoid the occurrence of watermarks when drying and simultaneously making the drying process easier to control.

DISCLOSURE OF INVENTION

The invention solves the problems by providing a method for drying a plate-like article. The method comprises rinsing with an aqueous rinsing-liquid with subsequent rinsing with an organic solvent (in liquid form),
  wherein the organic solvent has a water content of not more than 20 mass-%
  wherein the organic solvent is supplied at a solvent temperature, which is at least 30° C. and a not higher than 60° C.

The aqueous solution preferably is DI-water (de-ionised water) but can also be a diluted solution of ozone, hydrofluoric acid, hydrochloric acid, carbonic acid, or ammonia.

Subsequent rinsing means that the start of rinsing with the organic solvent is after the start of rinsing with the aqueous solution. This means that both rinsing steps can be carried out immediately one after the other, or there can be a time-break between the two rinsing steps. Both rinsing steps can even timely overlap.

Preferably the organic solvent is miscible with water. The term miscible with water shall be understood that water can be dissolved in the solvent at a water-content of 0 to at least 10 mass-% (even more preferably below 2 mass-%).

In a preferred embodiment of the method the relative humidity is measured and the dew point is calculated from the relative humidity (e.g. by using Mollier-diagram) and the temperature, at which the organic solvent shall be supplied to the plate-like article, is selected in a range between 20K and 35K above the calculated dew point.

Without being bound to a theory it is believed that using an organic solvent for removing an aqueous rinsing solution results in cooling the surface of the plate-like article because of fast evaporation of the organic solvent. It is further assumed that the plate-like article thus is cooled below the dew point of the ambient air, which might lead to condensation of the moisture. Therefore water-droplets deriving from the moisture might generate watermarks.

By selecting a minimum temperature for the organic solvent when supplied in dependency of the humidity the drying performance could be dramatically improved.

Tab. 1 shows selected preferred ranges of the supply temperature of the organic solvent solution as a function of the dew point, which can be calculated from the measured relative humidity. In the first column the relative humidity of ambient air at 25° C. is listed, which equals the relative humidity of 20° C., which is listed in brackets ( ).

TABLE 1

| relative humidity at 25° C. [%] (equals the relative humidity at 20° C.) | dew point [° C.] as can be seen in Mollier-diagram | Preferred range of supply temperature [° C.] |
| --- | --- | --- |
| 19 (26) | 0.0 | 20.0-35.0 |
| 30 (40) | 6.0 | 26.0-41.0 |
| 40 (55) | 10.5 | 30.5-45.5 |
| 60 (80) | 16.7 | 36.7-51.7 |

Advantageously the organic solvent is selected from the group of alcohol (e.g. methanol, ethanol, 2-propanol), ketones (e.g. acetone), ester, ether. These solvents (especially 2-propanol) are well known in semiconductor industry, but other solvents such as hydro fluoro ethers can also be used.

Preferably the solvent temperature is at least 35° C., which gives an option that a higher humidity can be tolerated.

In a preferred embodiment the solvent temperature is not more than 55° C., which is preferred because of safety reasons if the organic solvent is flammable.

Advantageously the organic solvent has a water content of below 10 mass-%. This leaves a basically water-free surface, when the solvent residues evaporate.

This effect is even improved when the water content of below 5 mass-% or even below 2 mass-%.

Advantageously the plate-like article is rotated during rinsing with the organic solvent, but can also be linearly moved.

Advantageously the organic solvent is supplied at a volume flow in a range of 20 ml/min to 400 ml/min. Preferably the flow of the organic solvent is not more than 200 ml/min. Such a low flow of the organic solvent only became possible when using the organic solvent at an elevated temperature.

If the temperature of the dispensed organic solvent is kept at least 25K above the dew point the flow of the organic solvent can be selected below 100 ml/min without generating watermarks. This is not only environmentally desired but also helps to keep the drying costs low.

In another embodiment a fluorine containing solution (e.g. containing hydrogen fluoride, ammonium fluoride) is dispensed onto the disc-like article before the drying is conducted. Preferably such fluorine containing solution is diluted hydrogen fluoride, which is an aqueous solution with an analytical concentration of hydrogen fluoride of below 1 g/l.

MODE(S) FOR CARRYING OUT THE INVENTION

A preferred method is carried out as follows:

After a 300 mm semiconductor wafer (a plate-like article) has been placed onto a spin-chuck and the wafer has been gripped by the gripping pins of the spin-chuck a wet process is carried out wherein different liquids are subsequently dispensed onto the wafer. When dispensing the liquids the dispensing nozzle can be moved across the wafer at a selected speed from the centre towards the edge and back to centre. This movement can be repeated as long as the respective liquid is dispensed. The spin speed during dispensing the cleaning liquids is selected in a range of preferably 300 rpm and 2000 rpm.

First diluted hydrofluoric acid with an HF concentration of 0.01 g/l is dispensed, second a rinsing liquid (e.g. de-ionized water) is dispensed, third the rinsing liquid is turned off and simultaneously the organic solvent supply is turned on, fourth the organic solvent and nitrogen are dispensed simultaneously, and fifth a spin off step.

The media arm used for this process comprises a nozzle head, which comprises three nozzles. There is a nozzle to dispense diluted hydrogen fluoride or de-ionized water, a nozzle to dispense the organic solvent (the organic solvent here is 2-propanol) and a nozzle for supplying nitrogen. Such a nozzle head and the media arm associated therewith is further described e.g. in WO2008/041211A2.

The sequence for the drying method is carried out in the following order:

Step A: As a last chemical dispensing step diluted hydrogen fluoride (concentration between 1 g/l to 100 g/l) is dispensed in the wafer centre for a time between 30 s to 200 s, with a flow rate of 1.7-2 l/min while the wafer is rotating at a spin-speed in a range of 500-1200 rpm (e.g. 800 rpm). The temperature of the medium is 22° C.

Step B: The rinsing step (de-ionized water) is also dispensed in the wafer centre for a time of 20 s, with a flow rate of 1.7-2 l/min while the wafer is rotating at a spin-speed in a range of 500-1200 rpm (e.g. 800 rpm). The temperature of the medium is 22° C.

Step C: The drying step: A nozzle-head scans the wafer once from the centre to the edge at an average speed of 10 mm/s, where at the centre the scanning speed is 20 mm/s and the scanning speed is decrease when moving towards the edge to 5 mm/s. During the scan, 2-propanol is dispensed from the centre till the edge of the wafer. Simultaneously nitrogen is blowing as 2-propanol is supplied. 2-propanol is switched off at the edge of the wafer. 2-propanol has a temperature of 45° C. The 2-propanol is heated with a heat exchanger. The temperature is measured at a distance of 5 cm before the nozzle head. The 2-propanol flow is preferably set between 50 ml/min to 160 ml/min. The cross-sectional area of the nozzle orifice is 8 mm$^2$ (deriving from a ⅛ inch tube). Therefore the flow velocity is in a range of between 0.1 m/s and 0.33 m/s. The warm 2-propanol increases the wafer temperature, which dramatically decreases the number of watermarks—it is believed that this is due to a decrease of condensation because the temperature wafer surface can so be kept above the dew point of the ambient air. Nitrogen flow is increased during the movement of the nozzle-head from the centre to the edge (from 50% to 100% of the maximum nitrogen flow). At maximum (near the edge), the nitrogen flow is around 30 l/min. The chuck speed is reduced linearly from 1100 rpm to 450 rpm, while the organic-solvent-dispense-nozzle moves from the centre towards the edge of the disc-like article. If the temperature of the dispensed 2-propanol is kept at (or above) 45° the flow of the 2-propanol can be selected below 100 ml/min without generating watermarks, which can significantly reduce the consumption of 2-propanol.

Step D: The final step is a rotation without any chemical dispense for 10 s with a rotated spin speed of 1500 rpm. Although this step is not necessary it avoids any back splashing of liquid droplets, which might adhere on the wafer backside and/or on the chuck that rotates the wafer.

The invention claimed is:

1. A method for drying a plate-like article, the method comprising the steps of:
    rinsing the plate-like article by dispensing an aqueous rinsing liquid to the plate-like article; and
    subsequently rinsing by dispensing a liquid organic solvent to the plate-like article, the organic solvent having a water content of below 20 mass %;
    measuring a relative humidity of ambient air;
    calculating a dew point from the relative humidity; and
    selecting a solvent temperature at which the liquid organic solvent is supplied to the plate-like article as a function of the calculated dew point,
    wherein the solvent temperature is in a range between 20K and 35K above the calculated dew point, and the solvent temperature is at least 30° C. and not higher than 60° C.

2. The method according to claim 1, wherein the organic solvent is miscible with water.

3. The method according to claim 1, wherein the solvent temperature is at least 35° C.

4. The method according to claim 1, wherein the solvent temperature is not more than 55° C.

5. The method according to claim 1,
    wherein the plate-like article is rotated during rinsing with the organic solvent, and
    wherein a dispenser scans and dispenses the liquid organic solvent from a center of the plate-like article to an edge of the plate-like article.

6. The method according to claim 1, wherein the organic solvent is supplied at a volume flow in a range of 20 ml/min to 400 ml/min.

7. The method according to claim 1,
    wherein the solvent temperature of the organic solvent dispensed in the subsequent rinsing step is kept at least 25K above the calculated dew point, and
    wherein a flow of the liquid organic solvent is maintained below 100 ml/min without generating watermarks.

8. The method according to claim 1, wherein a fluorine containing solution is dispensed onto the plate-like article before the rinsing and subsequent rinsing steps are conducted.

9. The method according to claim 2, wherein the organic solvent is selected from the group consisting of alcohols, ketones, esters, and ethers.

10. The method according to claim 2, wherein the organic solvent has a water content of below 10 mass %.

11. The method according to claim 8, wherein the fluorine containing solution is an aqueous solution that contains hydrogen fluoride at a concentration of below 1 g/l.

12. A method for drying a disc-shaped article, the method comprising:

a first dispensing step of dispensing an aqueous rinsing liquid to the disc-shaped article to rinse the disc-shaped article;

following said first dispensing step, a second dispensing step of dispensing a liquid organic solvent to the disc-shaped article to further rinse the disc-shaped article, the organic solvent having a water content of below 20 mass %; and at least prior to the second dispensing step, performing the steps of:

measuring a relative humidity of ambient air;

calculating a dew point from the relative humidity; and selecting a solvent temperature at which the liquid organic solvent is supplied to the disc-shaped article as a function of the calculated dew point, wherein the solvent temperature is in a range between 20K and 35K above the calculated dew point, and wherein the solvent temperature is at least 30° C. and not higher than 60° C.

13. The method according to claim 12,
wherein the disc-shaped article is rotated during at least said second dispensing step, and
wherein in said second dispensing step, a dispenser scans and dispenses the liquid organic solvent from a center of the disc-shaped article to an edge of the disc-shaped article.

14. The method according to claim 12,
wherein the organic solvent is supplied at a volume flow in a range of 20 ml/min to 400 ml/min, and
wherein the solvent temperature is not more than 55° C.

15. The method according to claim 12, further comprising:
prior to said first dispensing step, a step of dispensing a fluorine containing solution onto the disc-shaped article.

16. The method according to claim 12, wherein said second dispensing step further comprises dispensing a flow of nitrogen in gaseous form to the disc-shaped article, the flow of nitrogen to the disc-shaped article being dispensed from a source separate from that of the organic solvent.

17. The method according to claim 15, wherein the fluorine containing solution is an aqueous solution that contains hydrogen fluoride at a concentration of below 1 g/l.

18. The method according to claim 15, wherein said second dispensing step further comprises dispensing a flow of nitrogen in gaseous form to the disc-shaped article, the flow of nitrogen to the disc-shaped article being dispensed from a source separate from that of the organic solvent.

* * * * *